United States Patent [19]

Dorfman et al.

[11] Patent Number: 5,470,549
[45] Date of Patent: Nov. 28, 1995

[54] METHOD OF MAKING TUNGSTEN-COPPER COMPOSITE OXIDES

[75] Inventors: Leonid P. Dorfman, Athens; Michael J. Scheithauer, Ulster; David L. Houck, Towanoa; Nelson E. Kopatz, Sayre, all of Pa.

[73] Assignee: Osram Sylvania Inc., Danvers, Mass.

[21] Appl. No.: 361,415

[22] Filed: Dec. 22, 1994

[51] Int. Cl.$^6$ .............................. C01G 41/00; C01G 3/00
[52] U.S. Cl. ................................................ 423/61; 423/593
[58] Field of Search ........................................ 423/61, 593

[56] References Cited

PUBLICATIONS

V. V. Skorokhod et al., Reaction in the Cu–W–O System, Journal of Inorganic Materials of the Russian Academy of Sciences, vol. 20, No. 3, pp. 458–460 (1984), Mar.
A. K. Basu, F. R. Sale, Copper–tungsten Composite Powders by the Hydrogen Reduction of Copper Tungstate, Journal of Materials Science, 13 (1978) pp. 2703–2711, No Month.
Q. Chongliang et al., A Study on Fine Grain W–Cu Electrode Materials with High Homogeneity, Proceedings of the 13th International Plansee Seminar, Metallwerk Plansee, vol. 1, pp. 461–470(1993), No Month.
V. V. Skorokhod et al., Theory and Technology of Sintering, Thermal, and Chemicothermal Treatment Processes, Poroshkovaya Metallurgiya, No. 9 (249), pp. 9–13 (1983), Sep.

*Primary Examiner*—Steven Bos
*Attorney, Agent, or Firm*—Robert F. Clark

[57] ABSTRACT

A method for making a tungsten-copper composite oxide wherein an amount of an ammonium tungstate and an amount of an oxide or hydroxide of copper are combined without milling to form a mixture. The unmilled mixture is then dehydrated and fired at a temperature and for a time sufficient to form the tungsten-copper composite oxide.

12 Claims, No Drawings

METHOD OF MAKING TUNGSTEN-COPPER COMPOSITE OXIDES

CROSS REFERENCES TO RELATED APPLICATIONS

This application is related to application Ser. No. 08/362,024, filed concurrently herewith, the disclosure of which is hereby incorporated by reference.

FIELD OF THE INVENTION

This invention relates to the manufacture of tungsten-copper pseudoalloys. More particularly, this invention relates to methods of making tungsten-copper composite oxides as precursor materials for making tungsten-copper pseudoalloys.

BACKGROUND ART

Tungsten-copper (W-Cu) pseudoalloys have been used as electrical contact materials and electrodes. The basic methods for the fabrication of W-Cu pseudoalloys include: infiltration of a porous tungsten skeleton with liquid copper, hot pressing of blends of tungsten and copper powders, and various techniques incorporating liquid phase sintering, repressing, explosive pressing, and the like. It is desirable to be able to manufacture articles made from W-Cu pseudoalloys at or near the theoretical density of the pseudoalloy. Besides having improved mechanical properties, the higher density pseudoalloys have higher thermal conductivities which are critical for the application of W-Cu pseudoalloys as heat sink materials for the electronics industry.

One method for producing high density W-Cu pseudoalloys consists of liquid-phase sintering of ultrafine W-Cu composite powders. Such composite powders may be produced, for example, by hydrogen co-reduction of tungsten and copper oxide blends. Another method is the direct reduction of copper tungstates. It has been demonstrated that the direct hydrogen reduction of copper tungstates imparts a high degree of phase dispersion and homogeneity to the W-Cu pseudoalloys resulting in superior thermomechanical properties. The reason for this is because copper tungstates provide a metallurgical environment were copper and tungsten are mixed together at an atomic level.

There are a number of W-Cu composite oxides in the Cu-W-O system including copper tungsten bronzes (nonstoichiometric W-Cu composite oxides of the form $Cu_xWO_3$, x=0.26, 0.34, and 0.77), cupric tungstate ($CuWO_4$), cuprous tungstate ($Cu_2WO_4$), and copper orthotungstate ($Cu_3WO_4$). The copper content in these composite oxides spans the 10 to 50 wt. % copper range in the W-Cu pseudoalloys of particular interest to the industry. Most of the work to this point has focused on the reduction of cupric tungstate ($CuWO_4$) to form W-Cu pseudoalloys. This is apparently because the relative copper content of cupric tungstate (i.e. relative to tungsten), 25.7 wt. %, is approximately in the middle of the technically important range. Adjustment of the relative copper content of the composite oxide in the 10–25% range can be accomplished by adding $WO_3$ to $CuWO_4$.

One technique for forming $CuWO_4$ involves the liquid precipitation of a hydrated tungstate from aqueous solutions of $CuSO_4 \cdot 5H_2O$ and $Na_2WO_4$ or H and $CuCO_3 \cdot Cu(OH)_2$. However, it has been found that the W-Cu pseudoalloy powders obtained from the reduction of precipitated tungstates are difficult to compact and thus the densities of the sintered pseudoalloys were low. Additionally, the solution-precipitation process is lengthy and the hydrometallurgical parameters are difficult to control.

Another technique involves the solid-phase synthesis of $CuWO_4$ by firing intimate mixtures of equimolar proportions of CuO and $WO_3$ (cupric tungstate may also be written as $CuO \cdot WO_3$). The W-Cu pseudoalloy powders obtained by the reduction of cupric tungstate made by this technique exhibit a uniform distribution of phases and desirable compacting and sintering properties. However, it is necessary to mill the $CuO/WO_3$ mixture to form an intimate mixture prior to firing in order to reduce the diffusion distances and enhance the solid state reactions. Such intimate mixing is achieved by dry or wet milling of the reactants with hard metal or ceramic milling media. Unfortunately, the energy of mechanical impact and friction inevitably cause erosion of the milling media and contamination of the material being milled. Wet milling can additionally promote undesirable chemical reactions between the reactants and the milling media thereby adding to the contamination of the mixture. Contamination of the reactant mixture from the milling process can seriously impair the use of W-Cu pseudoalloys as heat sink materials. Thus, since the milling step increases the risk of contamination and adds another step to the manufacturing process, it would be desirable to have a method of producing W-Cu composite oxide powders having similar characteristics without having to mill the reactants to form an intimate mixture.

SUMMARY OF THE INVENTION

It is an object of this invention to obviate the disadvantages of the prior art.

It is another object of this invention to provide a method of producing W-Cu composite oxides from unmilled mixtures of reactants.

It is a further object of this invention to provide a method for producing a W-Cu composite oxide in a static bed without mixing of the reactants during firing.

It is a still further object of this invention to provide a method of producing W-Cu composite oxides which can tolerate a wide range of reactant particles sizes.

In accordance with one aspect of the invention, there is provided a method of making a tungsten-copper composite oxide, comprising the steps of blending an amount of an ammonium tungstate and an amount of an oxide or hydroxide of copper to form an unmilled mixture, dehydrating the unmilled mixture, and firing the unmilled mixture at a temperature and for a time sufficient to form the tungsten-copper composite oxide.

In accordance with another aspect of the invention, there is provided a method of making a tungsten-copper composite oxide powder, comprising the steps of:

blending an amount of an ammonium tungstate and an amount of an oxide or hydroxide of copper to form an unmilled mixture having a dehydration temperature;

forming a bed of the unmilled mixture in a furnace having a temperature below the dehydration temperature of the unmilled mixture;

increasing the temperature of the furnace to a temperature sufficient to form the tungsten-copper composite oxide, the temperature of the furnace being increased at a rate sufficient to allow the unmilled mixture to become dehydrated prior to the formation of the tungsten-copper composite; and firing the unmilled mixture at the temperature sufficient to form the tungsten-copper composite oxide and for a time sufficient to form the tungsten-copper composite oxide powder.

DESCRIPTION OF THE PREFERRED EMBODIMENTS

For a better understanding of the present invention, together with other and further objects, advantages and capabilities thereof, reference is made to the following disclosure and appended claims.

We have found that by using an ammonium tungstate as the source of the tungsten in the solid state reaction it is possible to form W-Cu composite oxides without first milling the reactants to form an intimate mixture. The unmilled mixtures containing an ammonium tungstate may be fired under the same time and temperature conditions required to produce the W-Cu composite oxide from the conventional milled mixtures of $WO_3$ and CuO. The absence of the milling step reduces the possible contamination of the reactant mixture and, hence, the W-Cu composite oxide and the subsequently formed pseudoalloy. Additionally, we have found that, when cupric hydroxide, $Cu(OH)_2$, is used as the source of the copper in the reaction, a wide range of particle sizes for the tungsten source can be tolerated. This tends to make the process more economical because the selection of reactants is greater.

Two ammonium tungstates are of particular interest, ammonium paratungstate (APT), $10_4NH_45O \cdot 12WO_3 \cdot 5H_2O$ and ammonium metatungstate (AMT), $6NH_43O \cdot 12WO_3 \cdot xH_2O$ where x=0.75–1.25. Both of these tungstates are commercially available from OSRAM SYLVANIA Inc., Towanda, Pa. Although the degree of hydration and the ammonia content in these ammonium tungstates varies, both tungstates completely decompose into tungsten trioxide, $WO_3$, water and ammonia at temperatures above 250° C. Unmilled mechanical blends of APT or AMT with an oxide or hydroxide of copper, e.g. CuO, $Cu_2O$ or $Cu(OH)_2$, can be subjected to controlled thermal processing which leads to the loss of water and ammonia from the tungstates (and, if present, water from the hydroxide of copper) and to direct high yield synthesis of W-Cu composite oxides at 800° C. The ability to use unmilled mixtures of reactants is believed to result from the effective utilization of the high reactivity of the freshly produced $WO_3$ from the thermal decomposition of the ammonium tungstates. It is believed that this high reactivity results from the high surface area and surface energy of the freshly produced $WO_3$. For example, the surface area of APT increases dramatically from 0.37 $m^2/g$ to 6.0 $m^2/g$ after heating to 450° C. It is also believed that there is additional reactivity to be captured from the $WO_3$ because of its isomeric phase transformation from monoclinic to tetrahedral at 775° C. Thus, it would be desirable to carry out the solid-state synthesis as close to the phase transformation as possible to take advantage of the additional reactivity.

Unmilled mixtures of the reactants may be formed using standard blending equipment to mechanically blend the reactants (a V-blender is the preferred type of blender). Blending times of between 20–60 minutes have been used, however, a 30 minute blending time is preferred.

The conversion of the reactants is carried out in air. The unmilled mixture is charged into a tray made of a refractory material, such as fused silica (or a high temperature alloy such as Inconel), at or about room temperature and are slowly heated in a furnace to the reaction, or firing, temperature. A continuous belt furnace having thermal zones for providing the proper temperature gradient is preferred. The furnace should be supplemented with an ammonia scrubber to neutralize the ammonia released during the decomposition of the ammonium tungstates.

The slow heating of the mixture is needed to dehydrate the unmilled reactant mixture (dehydration as applied herein to the ammonium tungstate mixtures includes the evolution of ammonia as well as water). The mixture must be dehydrated at a rate which does not result in the rapid evolution of water and ammonia. If the dehydration occurs too rapidly, the static bed of reactants becomes disturbed which increases the interparticle distances and impedes the solid-state synthesis. We have found that the rate at which the mixtures are heated is inversely proportional to the bed depth of the mixture in the tray. It has been determined that for bed depths in the range of about 0.25 to about 1.0 inches the heating rate should be from about 5° C. to about 1° C. per minute. A bed depth of about 0.5 to about 0.75 inches and a heating rate of about 3° C. to about 2° C. per minute is preferred.

Once the firing temperature is reached, the mixture is held at that temperature until the W-Cu oxide composite is formed. In the case of $CuWO_4$, it has been determined that firing the reactants at about 800° C. for about 2 hours is sufficient to achieve at least 96% conversion of the reactants to $CuWO_4$.

The following non-limiting examples are presented.

EXAMPLES 1–4

Cupric tungstate, $CuWO_4$, was formed from unmilled mixtures of ammonium tungstates and copper oxides. The amounts of the different reactants and their surface areas are given in Table 1. The amounts of the APT and AMT reactants were determined on the basis of the $WO_3$ content of the tungstate thereby compensating for the loss of water and ammonia from the thermal decomposition of the tungstate prior to forming $CuWO_4$. The weight ratio of the reactants was chosen to provide a stoichiometric ratio of reactants after dehydration for the formation of $CuWO_4$. The AMT used in this and subsequent examples had the general formula $6NH_43O \cdot 12WO_3 \cdot H_2O$. The solid-state reactions for these examples are shown in Table 2.

Blends of the reactants were formed by mixing them in a V-blender for 30 minutes. Fused silica trays containing charges of 150 to 200 g of the unmilled reactant mixtures were placed in a laboratory tube furnace having adjustable temperature sections. The depth of material in the static beds was about ¾ inch. The trays were pulled through the furnace zones at a speed which yielded a rate of temperature increase of about 2–3° C./minute. Once the firing temperature was reached, the trays were held at the 800° C. firing temperature for 2 hours. The trays were then allowed to cool and the reaction products were checked by x-ray diffraction to confirm the conversion of the reactants to $CuWO_4$. The percent conversion of the reactants to cupric tungstate is given in Table 1. In all cases, almost a complete conversion of the reactants to $CuWO_4$ was achieved without having to mill the reactants to form an intimate mixture.

TABLE 1

| Reactant | Example 1 | Example 2 | Example 3 | Example 4 |
|---|---|---|---|---|
| APT (0.52 m²/g) | 656.2g | — | 522.24g | — |
| AMT (1.66 m²/g) | — | 619.4g | — | 492.2 g |
| CuO (1.23 m²/g) | 200.0g | 200.0g | — | — |
| Cu₂O (0.18 m²/g) | — | — | 143.08g | 143.08 |
| % Conversion to CuWO₄ at 800° C., 2 hours | 99 | 99 | 96 | 100 |

TABLE 2

| Example | Reaction |
|---|---|
| 1 | APT + 12CuO → 12CuWO₄ + 10NH₃ + 10H₂O |
| 2 | AMT + 12CuO → 12CuWO₄ + 6NH₃ + 4H₂O |
| 3 | APT + 6Cu₂O + 3O₂ → 12CuWO₄ + 10NH₃ + 10H₂O |
| 4 | AMT + 6Cu₂O + 3O₂ → 12CuWO₄ + 6 NH₃ + 4H₂O |

EXAMPLES 5–10

A number of W-Cu composite oxides were prepared having relative copper contents in the composite oxide of between 5.0 and 25.7%, (the 25.7% composite oxide being $CuWO_4$). Ammonium metatungstate (1.66 m²/g) and cuprous oxide, $Cu_2O$, (0.18 m²/g) were blended together in various ratios. The unmilled mixtures were prepared, dehydrated and fired similarly to Examples 1–4. The firing conditions used to form the composite oxides were 775° C. for 2 hours. The ratio of $WO_3/CuWO_4$ for each composite oxide was measured using x-ray diffraction techniques. The ratios and the surface areas of the W-Cu composite oxide are given in Table 3. The oxide phases and their ratios detected in the reaction products were consistent with the expected results calculated from the amounts of reactants used.

TABLE 3

| % Copper Content in Composite Oxide Relative to Tungsten | Ratio of WO₃/CuWO₄ Expected | Ratio of WO₃/CuWO₄ Est. from XRD Measurements | Surface Area (m²/g) |
|---|---|---|---|
| 5.0 | 5.566 | 5.7 | 0.29 |
| 10.0 | 2.110 | 2.5 | 0.30 |
| 12.5 | 1.419 | 1.5 | — |
| 15.0 | 0.958 | 1.1 | 0.38 |
| 20.0 | 0.382 | 0.43 | 0.38 |
| 25.7 | 0 | 0 | 0.31 |

Scanning electron micrographs of the synthesized W-Cu composites showed that the powders having a low $CuWO_4$ content exhibited a hollow sphere structure. This hollow sphere morphology progressively decreased with the increasing amounts of the $CuWO_4$ phase. At high $CuWO_4$ content, a total breakdown of the spherical morphology and the formation of $CuWO_4$ crystals was observed. Energy Dispersive X-ray analysis (EDS) found a homogenous dispersion of the $WO_3$ and $CuWO_4$ phases throughout the agglomerates of the synthesized composite oxides. No segregation of the two phases could be detected. Thus, these single composite oxides may be directly reduced to form pseudoalloys having homogeneous distributions of the metal phases. This is an improvement over methods which produce similar composite oxides by mechanically blending $CuWO_4$ with $WO_3$ prior to reduction. Such a mechanical blending tends to result in a less homogeneous distribution of the metal phases in the pseudoalloy and adds an additional step to the process of forming the pseudoalloy.

Examples 11–15

Cupric tungstate, $CuWO_4$, was made from unmilled mixtures of ammonium tungstates having a wide range of particle sizes and –325 mesh size CuO, $Cu_2O$ and $Cu(OH)_2$. The reactants were blended, dehydrated and fired as in Example 1. The amounts of the reactants were calculated to yield equimolar ratios after compensating for the loss of water and ammonia during dehydration. Each unmilled mixtures was fired at 800° C. for 2 hours. Table 4 shows the efficiency of conversion to $CuWO_4$ for the different combinations of reactants.

TABLE 4

| Tungsten Source | | Copper Source (100% –325 mesh) and Efficiency of Conversion to CuWO₄, 2 h. @ 800° C. | | |
|---|---|---|---|---|
| | Particle Size | CuO | Cu(OH)₂ | Cu₂O |
| AMT | Fine >25% –325 mesh | 99–100% | 99–100% | 99–100% |
| APT | Fine >25% –325 mesh | 99–100% | 99–100% | 96–98% |
| APT | medium 15–25% –325 mesh | 99–100% | 99–100% | 90–95% |
| APT | Coarse <15% –325 mesh | 99–100% | 99–100% | <90% |
| APT | Extra Course –60 +100 Mesh | <90% | 96–98% | <90% |

It is clear from Table 4 that cupric hydroxide has the broadest application for reacting with ammonium tungstates. All of the reactions using the hydroxide exhibited a high degree of conversion to the composite oxide, $CuWO_4$. Such versatility makes the process for making W-Cu composite oxides more economically desirable because the choice of reactant materials is greater.

While there has been shown and described what are at the present considered the preferred embodiments of the invention, it will be obvious to those skilled in the art that various changes and modifications may be made therein without departing from the scope of the invention as defined by the appended claims.

We claim:

1. A method of making a tungsten-copper composite oxide, comprising the steps of blending an amount of an ammonium tungstate and an amount of an oxide or hydroxide of copper without milling to form an unmilled mixture, dehydrating the unmilled mixture, and then firing the unmilled mixture at a temperature and for a time sufficient to form the tungsten-copper composite oxide.

2. The method of claim 1 wherein the mixture is fired in air.

3. The method of claim 1 wherein the ammonium tungstate is ammonium paratungstate or ammonium metatungstate.

4. The method of claim 1 wherein the oxide of copper is cupric oxide or cuprous oxide and the hydroxide of copper is cupric hydroxide, $Cu(OH)_2$.

5. The method of claim 1 wherein the mixture is fired at about 800° C. for about 2 hours.

6. A method of making a tungsten-copper composite oxide, comprising the steps of:

blending an amount of an ammonium tungstate and an amount of an oxide or hydroxide of copper without milling to form an unmilled mixture having a dehydration temperature;

forming a bed of the unmilled mixture in a furnace having a temperature below the dehydration temperature of the unmilled mixture; increasing the temperature of the furnace to a temperature sufficient to form the tungsten-copper composite oxide, the temperature of the furnace being increased at a rate sufficient to dehydrate the unmilled mixture prior to the formation of the tungsten-copper composite; and firing the unmilled mixture at the temperature sufficient to form the tungsten-copper composite oxide and for a time sufficient to form the tungsten-copper composite oxide.

7. The method of claim 6 wherein the mixture is fired in air.

8. The method of claim 6 wherein the ammonium tungstate is ammonium paratungstate or ammonium metatungstate.

9. The method of claim 6 wherein the oxide of copper is cupric oxide or cuprous oxide and the hydroxide of copper is cupric hydroxide, $Cu(OH)_2$.

10. The method of claim 6 wherein the mixture is fired at about 800° C. for about 2 hours.

11. The method of claim 6 wherein the bed has a bed depth of between about 0.25 inches to about 1.0 inches and the rate of temperature increase is between about 5° C. to about 1° C. per minute.

12. The method of claim 11 wherein the bed depth is between about 0.5 inches to between about 0.75 inches and the rate of temperature increase is between about 3° C. to about 2° C. per minute.

* * * * *

UNITED STATES PATENT AND TRADEMARK OFFICE
CERTIFICATE OF CORRECTION

PATENT NO : 5,470,549
DATED : Nov. 28, 1995
INVENTOR(S): Dorfman et al

It is certified that error appears in the above-identified patent and that said Letters Patent is hereby corrected as shown below:

Title page
  item [76], The residence of inventor David L. Houck, "Towanoa", should read --Towanda"--.

Column 2, Line 3, "or H" should read --or $H_2WO_4$ --.

Column 3, Line 45, "$10_4NH_450 \cdot 12WO_3 \cdot 5H_2O$"

should read -- $10NH_450 \cdot 12WO_3 \cdot 5H_2O$"--.

Signed and Sealed this

Twenty-sixth Day of May, 1998

*Attest:*

BRUCE LEHMAN

*Attesting Officer*   *Commissioner of Patents and Trademarks*